United States Patent
Nagano

(10) Patent No.: US 7,193,218 B2
(45) Date of Patent: Mar. 20, 2007

(54) RADIATION DETECTION DEVICE, METHOD OF PRODUCING THE SAME, AND RADIATION IMAGE PICK-UP SYSTEM

(75) Inventor: Kazumi Nagano, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 194 days.

(21) Appl. No.: 10/971,150

(22) Filed: Oct. 25, 2004

(65) Prior Publication Data
US 2005/0092927 A1 May 5, 2005

(30) Foreign Application Priority Data
Oct. 29, 2003 (JP) .............................. 2003-369184

(51) Int. Cl.
*G01T 1/20* (2006.01)
(52) U.S. Cl. ................................... 250/370.11
(58) Field of Classification Search ............ 250/370.11
See application file for complete search history.

(56) References Cited

U.S. PATENT DOCUMENTS

| | | | |
|---|---|---|---|
| 4,736,236 A * | 4/1988 | Butt ............................ | 257/672 |
| 5,132,539 A * | 7/1992 | Kwasnick et al. ....... | 250/361 R |
| 6,262,422 B1 | 7/2001 | Homme et al. ......... | 250/370.11 |
| 6,469,305 B2 | 10/2002 | Takabayashi et al. ... | 250/361 R |
| 2002/0121606 A1 * | 9/2002 | Okada et al. ........... | 250/370.11 |
| 2003/0116716 A1 * | 6/2003 | Homme et al. ......... | 250/370.11 |
| 2004/0178350 A1 | 9/2004 | Nagano ................... | 250/370.11 |
| 2004/0195514 A1 | 10/2004 | Nagano ................... | 250/370.11 |

FOREIGN PATENT DOCUMENTS

| | | |
|---|---|---|
| JP | 9-145845 | 6/1997 |
| JP | 2000-009845 | 1/2000 |
| JP | 2000-284053 | 10/2000 |

* cited by examiner

Primary Examiner—David Porta
Assistant Examiner—Shun Lee
(74) Attorney, Agent, or Firm—Fitzpatrick, Cella, Harper & Scinto

(57) ABSTRACT

To eliminate defects in sealing the end of a scintillator and in sealing the end of a terminal of a flexible circuit board, to reduce the sealing processing time, to increase a pixel region, to eliminate image defects, and to enhance the service life, a radiation detection device comprises: a sensor panel comprising a photoelectric conversion portion and an electrode lead-out portion arranged in the outer periphery of the sensor panel; a flexible circuit board electrically connected to the electrode lead-out portion via a connection portion; a scintillator panel arranged on the photoelectric conversion portion and containing a scintillator layer; and a sealing resin comprising first and second sealing resins, the first sealing resin covering an end of the scintillator layer, and the second sealing resin covering the connection portion for the terminal of the flexible circuit board.

12 Claims, 9 Drawing Sheets

FIG. 10

| | FIRST SEALING RESIN | | | | SECOND SEALING RESIN | | | | CURING METHOD | TEST RESULTS |
|---|---|---|---|---|---|---|---|---|---|---|
| | TYPE | VISCOSITY (cP) | THIXOTROPIC PROPERTY | COLOR | TYPE | VISCOSITY (cP) | THIXOTROPIC PROPERTY | COLOR | | |
| EXAMPLE 1 | SEMI-FLOWABLE SILICONE RESIN | 14000 | — | BLACK | FLOWABLE SILICONE RESIN | 4000 | — | TRANS-PARENT | TOTALLY HEATING CURING (80°C, 15 HOURS) | STANDING STILL AT 60°C, A HUMIDITY OF 90% FOR 1000 HOURS, NO GENERATION OF IMAGE DEFECTS |
| EXAMPLE 2 | SEMI-FLOWABLE SILICONE RESIN | 12000 | — | TRANS-PARENT | FLOWABLE SILICONE RESIN | 5800 | — | PALE YELLOW | UV TWO-STEP CURING | STANDING STILL AT 60°C, A HUMIDITY OF 90% FOR 1000 HOURS, NO GENERATION OF IMAGE DEFECTS |
| EXAMPLE 3 | SEMI-FLOWABLE SILICONE RESIN | 1700 | HIGH | — | FLOWABLE SILICONE RESIN | 2100 | LOW | — | TOTALLY HEATING CURING (30°C, 10 HOURS) | STANDING STILL AT 60°C, A HUMIDITY OF 90% FOR 1000 HOURS, NO GENERATION OF IMAGE DEFECTS |
| EXAMPLE 4 | SEMI-FLOWABLE ACRYLIC RESIN | 12000 | — | — | FLOWABLE ACRYLIC RESIN | 200 | — | — | UV CURING, CURING AT ROOM TEMPERATURE | STANDING STILL AT 60°C, A HUMIDITY OF 90% FOR 1000 HOURS, NO GENERATION OF IMAGE DEFECTS |
| EXAMPLE 5 | SEMI-FLOWABLE ACRYLIC RESIN | 12000 | — | — | FLOWABLE SILICONE RESIN | 5800 | — | — | UV TWO-STEP CURING | STANDING STILL AT 60°C, A HUMIDITY OF 90% FOR 1000 HOURS, NO GENERATION OF IMAGE DEFECTS |

FIG. 11

| | FIRST SEALING RESIN | | | | CURING METHOD | TEST RESULTS |
|---|---|---|---|---|---|---|
| | TYPE | VISCOSITY (cP) | THIXOTROPIC PROPERTY | COLOR | | |
| COMPARATIVE EXAMPLE 1 | FLOWABLE SILICONE RESIN | 200 | — | — | HEATING CURING (23°C, 20 MINUTES) | GENERATION OF IMAGE DEFECTS OCCURRING DUE TO THE IMPREGNATION OF THE SEALING RESIN INTO THE VOIDS OF THE FLUORESCENT MATERIAL LAYER |
| COMPARATIVE EXAMPLE 2 | SILICONE RESIN | 12000 | — | TRANSPARENT | UV CURING | STANDING STILL AT 60°C, A HUMIDITY OF 90% FOR 1000 HOURS, GENERATION OF IMAGE DEFECTS OCCURRING DUE TO THE CORROSION OF THE TERMINAL OF THE FLEXIBLE CIRCUIT BOARD |

RADIATION DETECTION DEVICE, METHOD OF PRODUCING THE SAME, AND RADIATION IMAGE PICK-UP SYSTEM

This application claims priority from Japanese Patent Application No. 2003-369184 filed Oct. 29, 2003, the contents of which are hereby incorporated by reference.

BACKGROUND OF THE INVENTION

1. Field of the Invention

The present invention relates to a scintillator panel for use in a medical diagnostic apparatus, a non-destruction inspection apparatus, or the like, a radiation detection device, a method of producing the radiation detection device, and a radiographic system. In particular, the present invention relates to a scintillator panel, a radiation detection device, and a radiation image pick-up system for use in X-ray photography. It is to be noted that, in this invention, the radiation includes electromagnetic waves such as X-rays, γ-rays, and so forth.

2. Description of the Related Art

In general, X-ray film systems comprise a fluorescent screen containing an X-ray scintillator layer therein and a two-sided coating material. In recent years, digital radiation-detection apparatuses, containing an X-ray scintillator layer and a two-dimensional photodetector, respectively, have been intensively investigated and developed. The image characteristics of such digital radiation-detection apparatus are high, and the image data, which is digital, can be transferred to and stored on network computer systems for common use. Thus, various patent applications have been filed.

For example, Japanese Patent Laid-Open Nos. 2000-9845 and 9-145845 describe radiation detection devices with increased sensitivity and sharpness. In these apparatuses, a supporting plate having a scintillator layer for converting radiation to light-beams detectable by photoelectric conversion elements is bonded to a photodetector which contains a photoelectric conversion element portion, the photoelectric conversion element portion having electrical elements such as a plurality of photosensors, TFTs (thin film transistor) and the like arranged in a two-dimensional pattern. Moreover, in the radiation detection device disclosed in Japanese Patent Laid-Open No. 2000-284053, a scintillator layer for converting radiation to light-beams detectable by photoelectric conversion elements is formed directly on a photodetector, the photodetector containing a photoelectric conversion element portion in which a plurality of photosensors and electrical elements such as TFTs or the like are provided in a two-dimensional arrangement.

FIG. 9 is a cross-sectional view showing a known radiation detection device. In FIG. 9, a sensor panel 100 is shown which comprises a glass substrate 101, a photoelectric conversion element portion 102 comprising photosensors using amorphous silicon and TFTs, a wiring 103, an electrode lead-out portion (electrode pad) 104, and a protection layer 105 made of silicon nitride or the like. Moreover, a scintillator panel (also called a scintillator panel) 110 is bonded to the sensor panel 100 by means of an adhesive or a tacky-adhesive. The scintillator panel 110 comprises a scintillator supporting plate 111 and a scintillator layer 112, which are formed so as to correspond to the photoelectric conversion element portion 102. An anisotropic conductive adhesive 3 is formed on a terminal 2a of a flexible circuit board 2 having a detection integrated circuit IC (not shown) mounted thereon. The electrode lead-out portion 104 and the sensor panel 100 are bonded to each other via the adhesive by heating and pressing. The upper side of the electrode lead-out portion 104, located between the end (connection portion) of the terminal 2a and the end of the scintillator panel 110 is sealed with a sealer (sealing resin) 1.

In the above-described known examples, the terminal 2a of the flexible circuit board 2 is bonded to the electrode lead-out portion 104 via the anisotropic conductive adhesive 3 provided on the terminal 2a in advance, by heating and pressing, as shown in FIG. 9. The anisotropic conductive adhesive 3 provided on the terminal 2a is arranged slightly on the inner side of the end of the terminal 2a, so that the adhesive is prevented from being forced out from the end of the terminal 2a when the terminal 2a and the electrode lead-out portion 104 are bonded to each other by heating and pressing (see FIG. 9).

According to the known examples, sealing resin can be applied to the upper side of the terminal 2a to seal the terminal 2a of the flexible circuit board 2. In this case, it is difficult for the resin to flow into the stepped portion defined by the anisotropic conductive adhesive 3 and the underside of the end of the terminal 2a called the gap. Thus, in some cases, a pore 11 is formed (see FIG. 9).

Undesirably, water may permeate through the resin layer into the pore 11 (space) and contact with a wiring, thus forming a water layer. The water layer dissolves corrosive substances such as chlorides or the like, which in turn corrodes the wiring peeled and exposed on the electrode lead-out portion 104. Accordingly, in the case in which the pore 11 is formed in the gap, the sealing process must be continued until the resin flows into the gap so that the pore is eliminated, or a further resin is required to flow into the gap so that the pore is eliminated. Thus, problems occur in that it takes extra time to perform the sealing process.

On the other hand, in the case in which the pore 11 is not formed in the gap, a sealer (sealing resin) 1 is formed on the scintillator panel 110, so that water can be prevented from invading the scintillator panel 110 via the end thereof. The scintillator panel (or scintillator panel) 110 is reinforced, and the scintillator layer 112 can be prevented from peeling off from the sensor panel 100, the scintillator supporting plate 111, and so forth. In the case in which the scintillator layer 112 is formed of scintillator grains, 50% to 70% of the scintillator grains have a grain size of about 5 μm to 50 μm, 1% to 10% of a resin acts as a binder for the scintillator grains, and pores between the grains are contained in the scintillator layer 112. In the scintillator layer 112, pores present between the scintillator grains are not filled with the binder resin, so that light-rays emitted from the scintillator by the X-ray irradiation can be guided to the photoelectric conversion elements as efficiently as possible, thus obtaining high characteristics.

Conventionally, when the sealer 1 is applied to the end of the scintillator panel 110, the sealer 1 sinks into the pores between the grains of the scintillator layer 112 (see a sinking portion 10 shown in FIG. 9). In this case, the resin sinks into the scintillator layer 112 fills the pores of the scintillator layer 112. Thus, in X-ray photography, light-rays emitted from the scintillator grains are absorbed by the resin filling the pores. A region with different refractive indexes is formed, which is caused by the resin filling the pores, disturbing the advancement of light-beams. Thus, in some cases, undesirable image defects are generated, mainly in the end of the scintillator layer 112.

Accordingly, a sealing resin countermeasure region (in the range of at least about 3 mm or 5 mm) is provided on the sensor panel 100 in the outer periphery of the scintillator panel 110. Therefore, even if it is desired to increase a photographic region (pixel region, the pixel region cannot be set to exceed the countermeasure region.

It is an object of the present invention to provide a radiation detection device in which defects in sealing of the end of a scintillator panel and in sealing of the end of a terminal of a flexible circuit board are nearly eliminated, thereby reducing the sealing processing time and increasing a pixel region. Such a radiation device has nearly no image defects, has high image qualities and has a long service life. It is also an object of the present invention to provide a method of producing the radiation detection device.

SUMMARY OF THE INVENTION

The radiation detection device of the present invention, and the method for producing the same, comprise a sensor panel including photoelectric conversion elements arranged in a two-dimensional pattern, an electrode pad formed in the outer periphery thereof, and a scintillator layer formed on the photoelectric conversion elements. The terminal of a flexible print board and the sensor panel, which are connected to the electrode lead-out portion (electrode pad), and the end of the scintillator layer are tightly closed with a resin. Characteristically, a first sealing resin covers the end of the scintillator layer, and a second sealing resin covers the end of the terminal connection portion.

According to the present invention, there is provided a radiation detection device comprising: a sensor panel comprising a photoelectric conversion portion, the photoelectric conversion portion comprising a plurality of photoelectric elements arranged in a one-dimensional or two-dimensional pattern on a substrate, and an electrode lead-out portion arranged in the outer periphery of the substrate; a flexible circuit board electrically connected to the electrode lead-out portion via a connection portion; a scintillator panel arranged on the photoelectric conversion portion, the scintillator panel comprising a scintillator layer for converting radiation to a light ray which can be sensed by the photoelectric elements; and a sealing portion which covers an end of the scintillator layer and an end of the connection portion on the sensor panel, the sealing portion comprises a first sealing resin which covers the end of the scintillator layer, and a second sealing resin which covers the end of the connection portion, and is in contact with the first sealing resin.

In the radiation detection device of the present invention, preferably, the second sealing resin is formed with a material which is different from that of the first sealing resin. Preferably, the second sealing resin is formed with a material having a color different from that of a material of the first sealing resin. Also, preferably, the first sealing resin is formed with a material having a black-type color. Preferably, the sealing portion further comprises a third sealing resin which is in contact with the first sealing resin and the second sealing resin.

According to the present invention, there is also provided a method of producing a radiation detection device, the radiation detection device comprising a sensor panel comprising a photoelectric conversion portion, the photoelectric conversion portion comprising a plurality of photoelectric elements arranged in a one-dimensional or two-dimensional pattern on a substrate, and the sensor panel further comprising an electrode lead-out portion arranged in the outer periphery of the substrate, the method comprising the steps of; electrically connecting a flexible circuit board to the electrode lead-out portion via a connection portion; arranging a scintillator panel on the photoelectric conversion portion, the scintillator panel comprising a scintillator layer for converting radiation to a light ray which can be sensed by the photoelectric elements; covering the end of the scintillator layer with a first sealing resin material; and covering the connection portion with a second sealing resin material, the second sealing resin material being in contact with the first sealing resin material.

In the method of producing a radiation detection device of the present invention, the second sealing resin material comprises a material which is different from that of the first sealing resin material. Also, the second sealing resin material preferably has a viscosity different from that of the first sealing resin material. Preferably, the second sealing-resin material has a thixotropic property different from that of the first sealing resin material. Preferably, the second sealing resin material has a lower viscosity than that of the first sealing resin material. Also, the second sealing resin material preferably has a lower thixotropic property than that of the first sealing resin material.

According to the present invention, there is provided a radiation detection image pick-up system which includes: the above-described radiation detection device; a signal processing means for processing a signal from the radiation detection device so as to obtain an image; a recording means for recording a signal from the signal processing means; a displaying means for displaying a signal from the signal processing means; a transmission processing means for transmitting a signal from the signal processing means; and a radiation source for generating radiation.

The following advantages can be attained according to the present invention:

(1) Since the first sealing resin and the second sealing resin are formed in contact with each other. Thus, the electrode lead-out portion is sealed, and the moisture-proof properties of the electrode lead out portion, the scintillator layer, the connection portion, and the sensor panel are improved;

(2) Defects in the end of the scintillator layer are nearly eliminated. Moreover, the end of the scintillator layer is prevented from peeling off from the scintillator supporting plate or the sensor panel;

(3) The processing time required for the formation of the sealing resin in the electrode wiring portion of the terminal of the flexible circuit board is decreased;

(4) Defects are nearly eliminated from the end of the scintillator layer. In addition, it is not necessary to provide a sealing resin countermeasure region on the sensor panel. Therefore, the pixel region is increased to the size of the scintillator layer.

As described above, the present invention provides for a radiation detection device having high qualities and a long service life.

Further objects, features and advantages of the present invention will become apparent from the following description of the preferred embodiments (with reference to the attached drawings).

BRIEF DESCRIPTION OF THE DRAWINGS

FIG. 10 shows the preparation conditions of Examples 1, 2, 3, 4, and 5 and the test results thereof.

FIG. 11 shows the preparation conditions of Comparative Examples 1 and 2, and the test results.

DESCRIPTION OF THE PREFERRED EMBODIMENTS

Hereinafter, embodiments of the present invention are described in detail with reference to the drawings.

Figure 1:
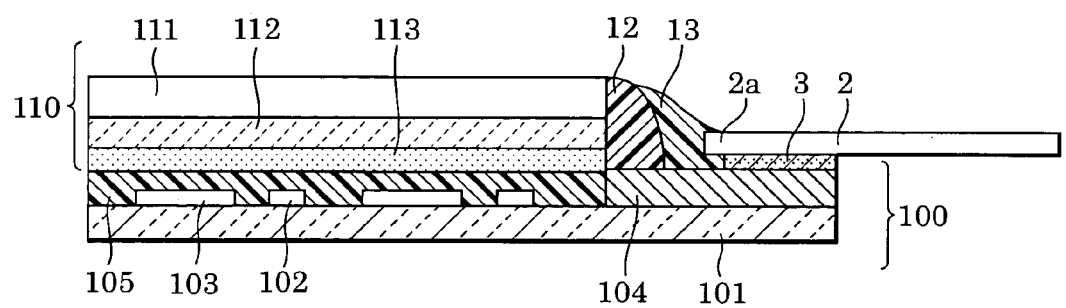
FIG. 1 is a cross-sectional view showing the configuration of an essential part of a radiation detection device according to a first embodiment of the present invention.
Figure 2:
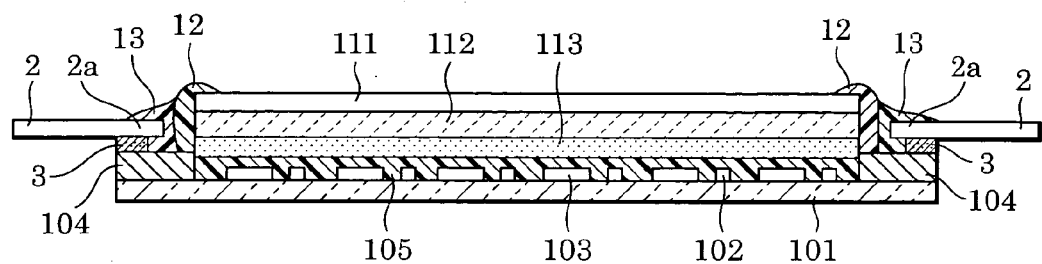
FIG. 2 is a cross-sectional view showing the whole configuration of the radiation detection device according to the first embodiment of the present invention.
Figure 3:
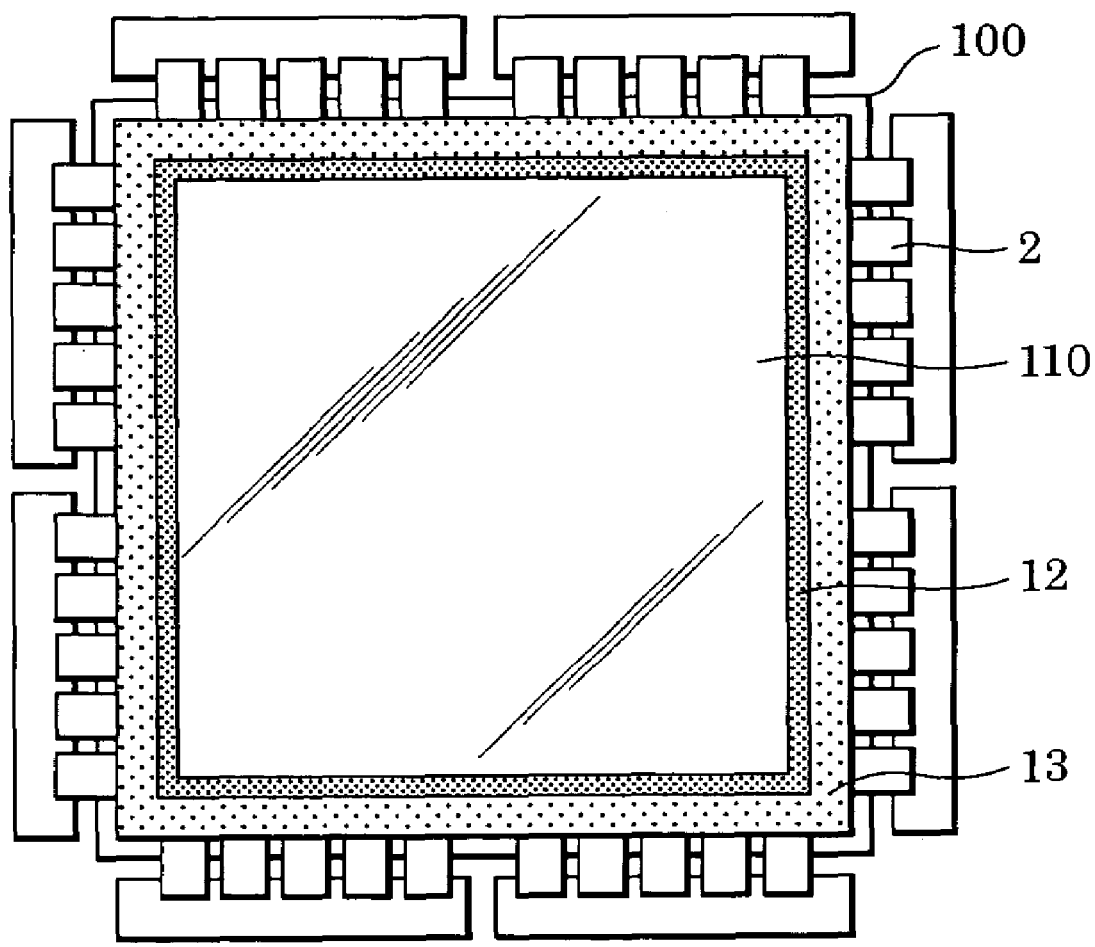
FIG. 3 is a plan view showing the whole configuration of the radiation detection device according to the first embodiment of the present invention.

In the radiation detection device shown in FIGS. 1 and 2, a sensor panel (also called "two-dimensional photodetector", or "a photoelectric conversion panel") 100 comprises a glass substrate 101, and a photoelectric conversion element portion 102, which corresponds to pixels composed of photosensors using amorphous silicon and TFTs which are two-dimensionally arranged on the photoelectric conversion element portion 102. The radiation detection device also comprises a wiring 103 formed on the glass substrate 101 and connected to the photoelectric conversion element portion 102, an electrode lead-out portion (electrode pad) 104 connected to the wiring 103, and a protection layer (first protection layer) 105 made of silicon nitride or the like. Moreover, a stiff protection layer (or second protection layer (not shown)) for the photoelectric elements may be formed on the protection layer 105. The stiff protection layer may be formed with a resin or the like.

Moreover, as shown in FIGS. 1 and 2, in the radiation detection device, a scintillator panel 110 is bonded to the sensor panel 100 by means of an adhesive or tacky-adhesive 113. The scintillator panel 110 comprises a scintillator supporting plate 111 and a scintillator layer 112 which are formed so as to correspond to the photoelectric conversion element portion 102. A terminal 2a of a flexible circuit board 2 having a detection integrated circuit IC (not shown) mounted thereon is bonded to the electrode lead-out portion 104 of the sensor panel 100 via an isotropic electroconductive adhesive by heating and pressing.

The scintillator layer 112 is preferably formed with, e.g., a scintillator having a granular crystal structure. Referring to a powdery scintillator that can be added to the scintillator paste, known scintillators such as $CaWO_4$, $Gd_2O_2S:Tb$, $BaSO_4:Pb$, and the like can be used. A scintillator used in the scintillator layer 112 has an average grain size of 5 to 100 μm, preferably, 5 to 50 μm. As an organic material incorporated in the scintillator paste, organic materials conventionally used for screen printing can be used. As a binder resin, known resins such as nitrocellulose, cellulose acetate, ethyl cellulose, polyvinylbutyral, polyester, vinyl chloride resins, vinyl acetate resins, acrylic resins, polyurethane, and so forth can be used. Moreover, as an organic solvent, known solvents such as ethanol, methyl ethyl ketone, butyl acetate, ethyl acetate, xylene, butyl carbitol, terpineol, and so forth can be used.

In the radiation detection device having the above-described configuration, the terminal 2a of the flexible circuit board 2 connected to the electrode lead-out portion 104, the sensor panel 100, the end of the scintillator layer 112, and the scintillator panel 110 are tightly sealed by means of a sealing resin (sealer). The sealing resin comprises a first sealing resin 12 and a second sealing resin 13. The first sealing resin 12 covers the end of the scintillator layer 112. The second sealing resin 13 covers the end of the terminal 2a of the flexible circuit board 2. The first sealing resin 12 and the second sealing resin 13 are in contact with each other.

The first and second sealing resins 12 and 13 are produced generally by processing and forming a material having a low water-permeability. In this embodiment, conventional sealing materials can be used. Thus, materials can be selected which are suitable for their respective use sites. In particular, the first sealing resin 12, which covers the end of the scintillator layer 112, is used in order to prevent the end of the scintillator layer 112 from being peeled and broken. The second sealing resin 13, which covers the end of the terminal 2a of the flexible circuit board 3 is used in order to tightly close an electrode wiring portion and the terminal 2a. For the first and second sealing resins 12 and 13, conventional sealing materials such as silicone resins, acrylic resins, epoxy resins, urethane resins, or the like can be used. Preferably, a material having a low water-permeability is used.

Hereinafter, a method of producing the radiation detection device shown in FIGS. 1 and 2 is described with reference to FIGS. 4A to 4C and FIGS. 5A to 5C.

Figure 4A:
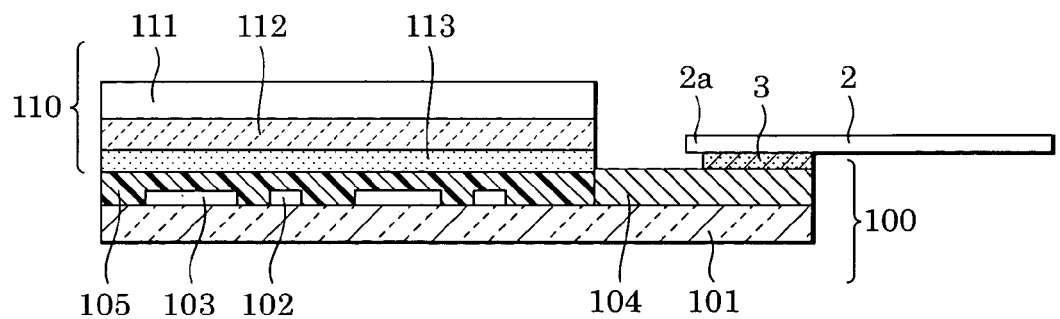
FIGS. 4A, 4B and 4C are cross-sectional views showing a method of producing a radiation detection device according to the first embodiment of the present invention.
Figure 5A:
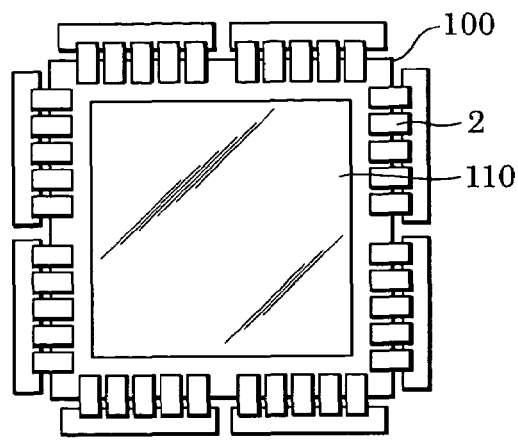
FIGS. 5A, 5B, and 5C are plan views showing the method of producing a radiation detection device according to the present invention.

First, as shown in FIGS. 4A and 5A, the end of the terminal 2a of the flexible circuit board 2 is bonded to the electrode lead-out portion 104 on the sensor panel 100 having the scintillator panel 110 bonded thereto, via the anisotropic conductive adhesive 3 by heating and pressing.

Figure 4B:
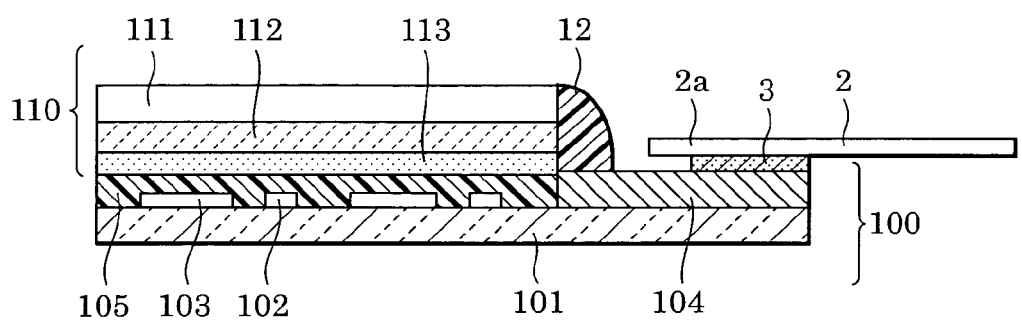
Figure 5B:
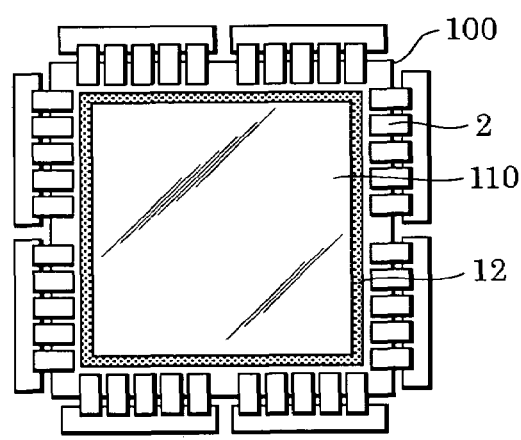

Subsequently, as shown in FIGS. 4B and 5B, the first sealing resin 12 is formed so as to cover the end of the scintillator layer 112.

Before application of the first sealing material 12, the regions of the scintillator layer 112 in which the scintillator grains are in point-contact with each other are only reinforced with a binder resin. Thus, these regions have a very brittle structure with respect to a peeling stress. The first sealing resin 12, which covers the end of the scintillator layer 112, causes all of the scintillator supporting plate 111, the scintillator layer 112, and the adhesive 113 to bond to the sensor panel 100. Thus, the first sealing resin 12 functions to prevent the scintillator layer 112 from peeling off, and functions to reinforce the scintillator layer 112. Moreover, pores exist in the end of the scintillator layer 112. The grain size of the scintillator grains is in the range of 5 μm to 50 μm, and the size of the pores is in the range of 5 or 6 μm to 50 or 60 μm.

The first sealing resin 12 preferably is a material which does not significantly invade into the pores of the scintillator grains of the Scintillator layer 112, which are in contact with the first sealing resin 12. Thus, the sinking-depth of the first sealing resin 12 into the pores is preferably not more than 1 mm, and more preferably, not more than 300 μm, depending on the degree of the pores of the scintillator grains. Preferably, materials for use in the first sealing resin 12 have a high viscosity, a low fluidity, a high surface tension, and are difficult to sink into the pores between the scintillator grains. A material having a high thixotropic property is preferred, since such a material can flow when it is applied, but flows with much difficulty after the material is shaped on the end (see FIG. 4B). As described above, the material, which flows into the pores between the scintillator grains of the scintillator layer 112 with mush difficulty, has a high shape-retaining property. Thus, when the material for the first sealing resin 12 is applied to the end of the scintillator layer 112, the first sealing resin 12 is prevented from flowing into the terminal portion 2a of the flexible circuit board 2. As a result, the first sealing resin 12 sufficiently seals the scintillator supporting plate 111, the scintillator layer 112, and the sensor panel 100 so as to be integrated with each other without sinking into the pores of the end of the scintillator layer 112.

In the case in which the sealing resin does not sink into the scintillator as described above, the sizes of the pixels in the photoelectric conversion element portion 102 which are on the sensor panel 100 side, with respect to the scintillator size of the scintillator layer which is on the scintillator panel 110 side, can be increased. Thus, the distance between the end of the scintillator layer 112 and the pixels of the photoelectric conversion element portion 102 is decreased. Accordingly, the shielding of the end of the scintillator layer 112 from light-rays becomes important. Thus, in order to prevent light-rays from leaking from the scintillator layer 112 to the outside and also to shield external light-rays, colored sealing resins, especially, black-colored sealing resins (black-color materials) are preferably used for the first sealing resin 12.

Moreover, in the case in which a moisture-proof protection layer (not shown) may be provided so as to cover the whole of the scintillator supporting plate 111 of the scintillator panel 110 or so as to cover the whole of the scintillator panel 110. In such a case, the ends of the moisture-proof protection layer, the scintillator supporting plate 111, the scintillator layer 112, and the tacky-adhesive 113 can be sufficiently sealed so as to be integrated with the sensor panel 100. Generally, the scintillator supporting plate 111 is formed with a resin. For example, a metal foil layer of aluminum or the like is preferably bonded to the scintillator panel 110 by means of a tacky-adhesion material or adhesive, since the moisture-proofing effect for the scintillator layer 112 can be enhanced.

Figure 4C:
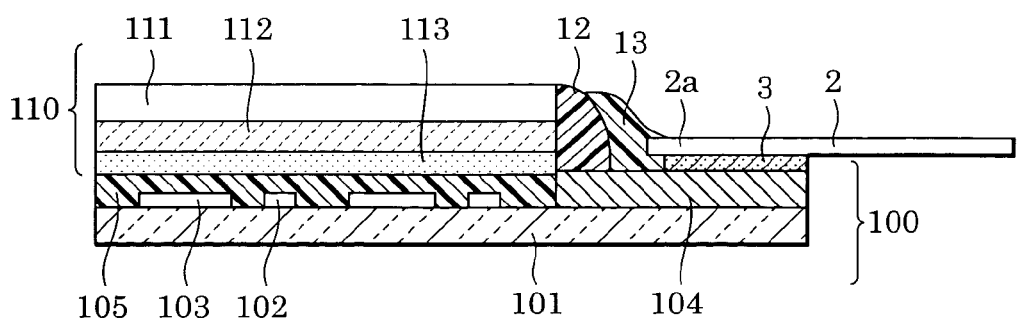
Figure 5C:
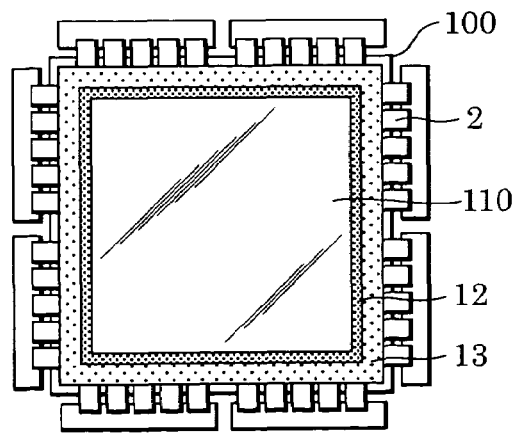

Thereafter, as shown in FIG. 4C and FIG. 5C, the second sealing resin 13 is formed in the vicinity of the terminal 2a of the flexible circuit board 2 above the electrode lead-out portion 104.

Generally, in the case in which the terminal 2a of the flexible circuit board 2 is bonded to the electrode lead-out portion 104 by heating and pressing, the size of the gap between the underside of the terminal 2a and the sensor panel 100 is in the range of about 5 to 100 µm. Preferably, the second sealing resin 13 has a low viscosity, so that the resin can be easily filled into the gap. Moreover, preferably, the material for the second sealing resin 13 preferably has a low surface tension, so that the material can be applied and formed in the gap while the gap is wetted with the material. Preferably, a resin material having a low thixotropic property is preferred, so that it can further flow in the gap step by step after the resin material is applied on the panel.

Generally, if water is contained in a high polymer, the water forms hydrogen bonds with the high polymer to produce a higher-order structure. Thus, the water is converted to the bound water. The bound water, while it is incorporated in the resin, causes no corrosion. However, if gaps such as pores or cracks exist in the resin, the water enters the pores, and forms a water layer in which the water can freely move as free water. If the pores exist in the boundary between the resin and the wiring portion, the water may cause corrosion. The use of the sealing material having a low moisture-permeability is effective in reducing the amount of water which enters the pores. From the standpoint of the formation of the sealing resin which prevents corrosion, it is most important that no pores exist in the boundary between the wiring portion and the sealing resin. Moreover, the sealing resin preferably contains a minimal amount of impurities, such as halogen, since the resin comes into contact with the exposed wiring portion.

As described above, the first and second sealing resins 12 and 13 are formed in contact with each other. Thereby, the resins can seal the electrode lead-out portion 104, and also can enhance the moisture proof properties of the electrode lead-out portion 104, the scintillator layer 112, the connection portion 3, and the sensor panel 100. The sealing resins existing on the end of the scintillator layer 112 and on the end of the terminal 2a of the flexible circuit board 2 are required to have significantly different properties. Thus, it is difficult to realize the required properties by use of the same materials. Therefore, the first sealing resin 12 and the second sealing resin 13 are formed with materials having different properties (e.g., viscosity, thixotropic property, and surface tension) depending on the purposes of the resins to be formed in the respective sites. Table 1 shows examples of the preferred properties (i.e., viscosity, thixotropic property, and surface tension) of materials for forming the first and second resins 12 and 13.

TABLE 1

| Item | First sealing resin | Second sealing resin |
| --- | --- | --- |
| Viscosity | High | Low |
| Thixotropic property | High | Low |
| Surface tension | High | Low |

The properties concerning the resins are listed in the column of Items in Table 1. A resin having a high thixotropic property does no sink into the pores between the grains of the scintillator, even if the resin has a low viscosity. Similarly, a resin having a high viscosity does not sink into the pores between the grains of the scintillator.

According to the above-described embodiment, the first and second sealing resins 12 and 13 are formed so as to be suitable for the resins to be provided in the different sites. However, as show in FIG. 6, a third sealing resin 14 may be formed on the first and second sealing resins 12 and 13. Thus, a three layer structure may be formed.

Figure 6:
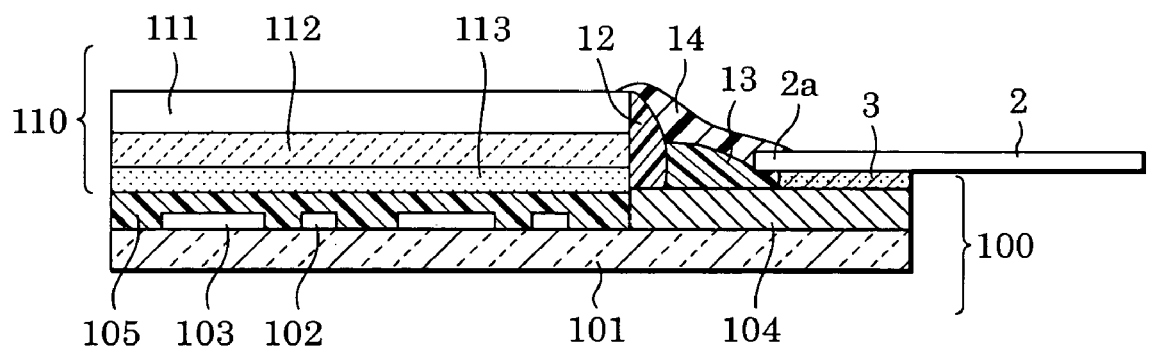
FIG. 6 is a cross-sectional view of a radiation detection device according to a second embodiment of the present invention.

In the example shown in FIG. 6, a first sealing resin 12 is formed in the vicinity of the end to be sealed of the scintillator layer 112 as described above. The first sealing resin 12 does not substantially sink into the pores between the grains of the scintillator, and functions to reinforce the scintillator against a peeling stress.

Moreover, as described above, a second sealing resin 13 is formed as a resin having a large space-filling capability. That is, the second sealing resin 13 serves to completely fill the gap defined by the electrode lead-out portion 104, the terminal of the flexible circuit board 2, and the anisotropic conductive adhesive 3 formed on the underside of the terminal.

Moreover, a third sealing resin 14 having a low water permeability and being effective in moisture-proofing is formed so as to cover the first sealing resin 12 as a scintillator reinforcing resin, and the second sealing resin 13 as a terminal gap filling resin, so that water is prevented from invading into both of the sites. As described above, the resins have different properties to satisfy the important characteristics required for their respective sites are formed. Thereby, the sealing portion has an improved sealing effect.

In this embodiment, for the sensor panel (two-dimensional photodetector) 100, the photoelectric conversion element portion 102, comprising photosensors using amorphous silicon and TFTs, is formed on the glass substrate 101. The radiation detection device may be produced by arranging an underlying layer and the scintillator layer 112 on a semiconductor single crystal substrate having an image pick-up device (detector) formed thereon, the image pick-up device having CCDs, MOSs, or the like arranged in a two-dimensional pattern.

Actual examples, and test results thereof, and comparative examples, and the test results thereof, of the radiation detection device of the present invention are now described as follows:

EXAMPLE 1

First, as shown in FIGS. 4A and 5A, the sensor panel 100 was formed. The scintillator panel 110 was bonded to the sensor panel 100. The flexible circuit board 2 was connected in the periphery thereof.

Specifically, the photoelectric conversion element portion (photodetection element) 102, comprising photosensors and TFTs on a semiconductor thin film made of non-crystalline silicon, and the wiring 103 were formed on the glass substrate 101. The protection layer (first protection layer) 105 made of SiNX, and the electrode lead-out portion 104 were formed thereon. Moreover, a protection layer (second protection layer, not shown) made of a cured polyimide resin was formed. Thus, a sensor panel 100 was prepared.

Subsequently, the scintillator layer 112 was formed by coating a gadolinium oxide sulfide scintillator and a polyvinylbutyral as a binder resin on the scintillator supporting plate 111 of a polyethyleneterephthalate sheet containing titanium oxide, and moreover an acrylic tacky-adhesive 113 was formed thereon. Thus, the scintillator panel 110 was prepared.

Subsequently, the prepared scintillator panel 110 was bonded to the surface of the protection layer 105 of the sensor panel 100 by means of the acrylic tacky-adhesive 113. The pixel region of the sensor panel 100 was increased by a scintillator bonding tolerance of +0.5 mm, based on the size of the scintillator. The terminal 2a of the flexible circuit board 2 was bonded, by heating and pressing, to the electrode lead-out portion 104 of the sensor panel 100 via the anisotropic conductive adhesive 3. Moreover, a sheet composed of a polyethyleneterephthalate and Al laminated to each other, which functions as a moisture-proof protection layer, was bonded with an acrylic tacky-adhesive so as to cover the whole of the scintillator panel 110.

Then, as shown in FIG. 4B, a silicone resin having a semi-fluid property (TSE3253 Black-colored resin, viscosity of 14000 cP, manufactured by GE Toshiba Silicones Co., LTD.), was used as a material for the first sealing resin 12, and was applied by means of a dispenser so as to cover the end of the scintillator layer 112 and the end of the protection layer. The resin was formed on the end of the scintillator layer 112 in such a manner that the resin did not flow toward the terminal 2a side of the flexible circuit board 2. The height of the resin from the sensor panel 100 was 1.6 mm.

Subsequently, as shown in FIGS. 4C and 5C, similarly, a silicone resin having a fluid property (TSE325, viscosity of 4000 cP, manufactured by GE Toshiba Silicones Co., Ltd.), was used as a material for the second sealing resin 13, and was applied. The application of the resin could be performed thirty seconds after the start, with no formation of pores in the gap under the terminal 2a. The height of the resin from the sensor panel 100 was 1.4 mm.

Then, the first and second sealing resins 12 and 13 coated on the sensor panel 100 were cured together with each other in a curing condition with a temperature of 80° C. and a time of 1.5 hour (h) in a thermostated bath.

Thus, the radiation detection device of the first example was produced.

EXAMPLE 2

Similarly to Example 1, the scintillator layer 112 and the terminal (electrode terminal) 2a of the flexible circuit board 2 were bonded to the sensor panel 100 (see FIGS. 4A and 5A).

Subsequently, the first sealing resin 12 and the second sealing resin 13 were formed at the same time, in the vicinity of the end of the layer 112 and in the vicinity of the terminal 2a of the flexible circuit board 2, respectively (see FIGS. 4B, 4C and FIGS. 5B and 5C).

That is, an acrylic resin having a semi-fluid property (XVL-14, viscosity of 12000 cP, manufactured by Kyoritsu Chemical Co., Ltd.), was used as a material for the first sealing resin 12, and was applied by means of a dispenser so as to cover the end of the scintillator layer 112 and the ends of the protection layer. The resin was formed in the vicinity of the end of the scintillator layer 112 in such a manner that the resin did not flow toward the terminal 2a side of the flexible circuit board 2. The height of the resin from the sensor panel 100 was 1.5 mm. After the resins were formed, the resins were irradiated with UV rays (power of 4500 mJ/cm$^2$, irradiation for 10 seconds) by means of a UV (ultraviolet rays) irradiation apparatus, so that the resins were cured.

Subsequently, an acrylic resin having a fluid property (TF-3348-15F2G, viscosity of 5800 cP, manufactured by Hitachi Chemical Co., Ltd.), was used as a material for the second sealing resin 13, and was applied. The application of the resin could be performed thirty seconds after the start with no formation of pores in the gap under the terminal 2a. The height of the resin from the sensor panel 100 was 1.5 mm. After the resins were formed, the resins were irradiated with UV rays (power of 1500 mJ/cm$^2$, irradiation for 10 seconds) by means of a UV (ultraviolet rays) irradiation apparatus, so that the resins were cured.

Thus, the radiation detection device of Example 2 was obtained.

EXAMPLE 3

Similar to Example 1, the terminal (electrode terminal) 2a of the flexible circuit board 2 was bonded to the sensor panel 100 (see FIGS. 4A and 5A).

Subsequently, the first sealing resin 12 and the second sealing resin 13 were formed at the same time, in the vicinity of the end of the scintillator layer 112 and in the vicinity of the terminal 2a of the flexible circuit board 2, respectively (see FIGS. 4B, 4C and FIGS. 5B and 5C).

That is, a silicone resin having a semi-fluid property (XE14-B5778, viscosity of 1700 cP, manufactured by GE Toshiba Silicones Co., Ltd.), was used as a material for the first sealing resin 12, and was applied by means of a dispenser so as to cover the end of the scintillator layer 112 and the ends of the protection layer. The resin was formed in the vicinity of the end of the scintillator layer 112 only in such a manner that the resin did not flow toward the terminal 2a side of the flexible circuit board 2. The height of the resin from the sensor panel 100 was 1.6 mm.

Subsequently, a silicone resin having a fluid property (XE5844, viscosity of 2100 cP, manufactured by GE Toshiba Silicones Co., Ltd.), was used as a material for the second sealing resin 13, and was applied in a similar manner. The height of the resin obtained immediately after the resin was coated was 1.5 mm from the sensor panel 100. However, the height of the resin obtained thirty seconds after the coating was 0.8 mm from the sensor panel 100. Thus, the resin could be coated with no pores being formed in the gap under the terminal 2a. Immediately after the resin was deformed and flown, the self-shape retaining capability of the resin was restored. Thus, it has been ascertained that the silicone resin having a semi-fluid property (XE14-B5778), used as the first sealing resin 12, has a higher thixotropic property than the silicone resin having a fluid property (XE5844), used as the second sealing resin 13.

Then, the first and second sealing resins 12 and 13 coated on the sensor panel 100 were cured together with each other in the curing condition of a temperature of 30° C. and a time of 10 hours (h) in a thermostated bath.

Thus, the radiation detection device of Example 3 was produced.

EXAMPLE 4

Similar to Example 1, the scintillator layer 112 and the terminal (electrode terminal) 2a of the flexible circuit board 2 were bonded to the sensor panel 100 (see FIGS. 4A and 5A).

Subsequently, the first sealing resin 12 and the second sealing resin 13 were formed in vicinity of the end of the scintillator layer 112 and in vicinity of the terminal 2a of the flexible circuit board 2, respectively (see FIGS. 4B, 4C and FIGS. 5B and 5C).

That is, the acrylic resin having a semi-fluid property (XVL-14, viscosity of 12000 cP, manufactured by Kyoritsu Chemical Co., Ltd.), was used as a material for the first sealing resin 12, and was applied by means of a dispenser so as to cover the end of the scintillator layer 112 and the end of the protection layer. The resin was formed adjacently to the end of the scintillator layer 112 in such a manner that the resin did not flow toward the terminal 2a side of the flexible circuit board 2. The height of the resin from the sensor panel 100 was 1.5 mm. After the resins were formed, the resins were irradiated with UV rays (power of 4500 mJ/cm$^2$, irradiation for 10 seconds) by means of a UV (ultraviolet rays) irradiation apparatus, so that the resins were cured.

Subsequently, similarly, an acrylic resin having a fluid property (TF-8147B, viscosity of 200 cP, manufactured by Hitachi Chemical Co., Ltd.) was applied so as to be adjacent to the end of the terminal 2a of the flexible circuit board 2. The application of the resin could be performed ten seconds after the start with no formation of pores in the gap under the terminal 2a. The height of the resin from the sensor panel 100 was 0.5 mm. After the resins were formed, the resins were dried with air-blow at 30° C. for 20 minutes.

Thus, the radiation detection device of Example 4 was produced.

EXAMPLE 5

Similar to Example 2, the scintillator layer 112 and the terminal (electrode terminal) 2a of the flexible circuit board 2 were bonded to the sensor panel 100 (see FIGS. 4A and 5A).

Figure 7:
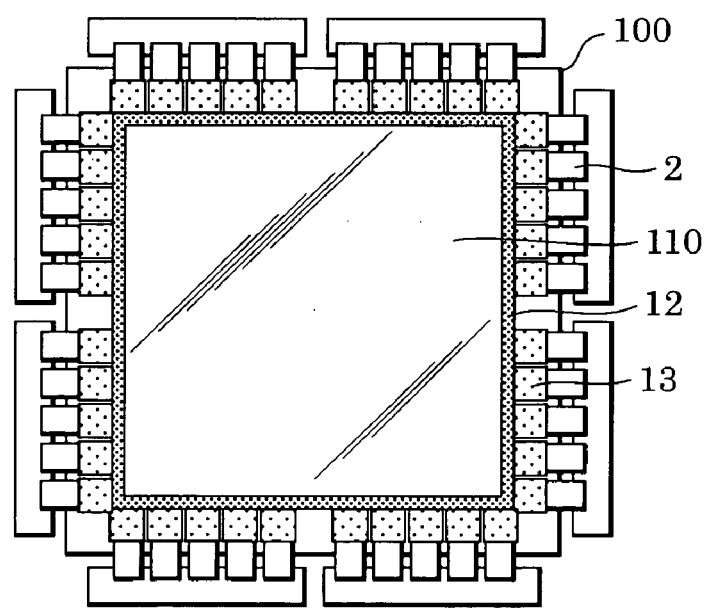
FIG. 7 is a plan view of the radiation detection device according to the second embodiment.

Subsequently, the first sealing resin 12 and the second sealing resin 13 were formed at the same time in the vicinity of the end of the scintillator layer 112 and in the vicinity of the terminals 2a of the flexible circuit board 2, respectively (see FIGS. 4B and 4C). It is to be noted that the second sealing resin was formed so as to individually cover the outer peripheries of the ends of the terminals of the flexible circuit boards (see FIG. 7).

That is, an acrylic resin having a semi-fluid property (XVL-14, viscosity of 12000 cP, manufactured by Kyoritsu Chemical Co., Ltd.), was used as a material for the first sealing resin 12, and was applied by means of a dispenser so as to cover the end of the scintillator layer 112 and the end of the protection layer. The resin was formed in the vicinity of the end of the scintillator layer 112 only in such a manner that the resin did not flow toward the terminal 2a side of the flexible circuit board 2. The height of the resin from the sensor panel 100 was 1.5 mm. After the resin was formed, the resin was irradiated with UV rays (power of 4500 mJ/cm$^2$, irradiation for 10 seconds) by means of a UV (ultraviolet rays) irradiation apparatus, so that the resins was cured.

Subsequently, an acrylic resin having a fluid property (TF-3348-15F2G, viscosity of 5800 cP, manufactured by Hitachi Chemical Co., Ltd.), was used as a material for the second sealing resin 13, and was applied in the vicinity of the end of the terminal 2a of the flexible circuit board 2. The application of the resin could be performed with no formation of pores in the gap existing under the terminal 2a. The height of the resin from the sensor panel 100 was 1.5 mm. After the resin was formed, the resin was irradiated with UV (ultraviolet) rays (power of 1500 mJ/cm$^2$, irradiation for 10 seconds) by means of a UV irradiation apparatus, so that the resin was cured.

Thus, the radiation detection device of Example 5 was obtained.

The radiation detection devices of Examples 1, 2, 3, 4, and 5 were let to stand in the environment of a temperature of 60° C. and a humidity of 90% for 1000 hours (h). After the standing, the radiation detection devices were irradiated with X-rays, and thus, images were obtained. It was observed whether the obtained images were deficient or not due to the peeling or breaking of the scintillators. All of the images of Examples 1, 2, 3, 4, and 5 were found not to be deficient.

FIG. 10 shows the preparation conditions of Examples 1, 2, 3, 4, and 5 and the test results thereof.

COMPARATIVE EXAMPLE 1

Figure 9:
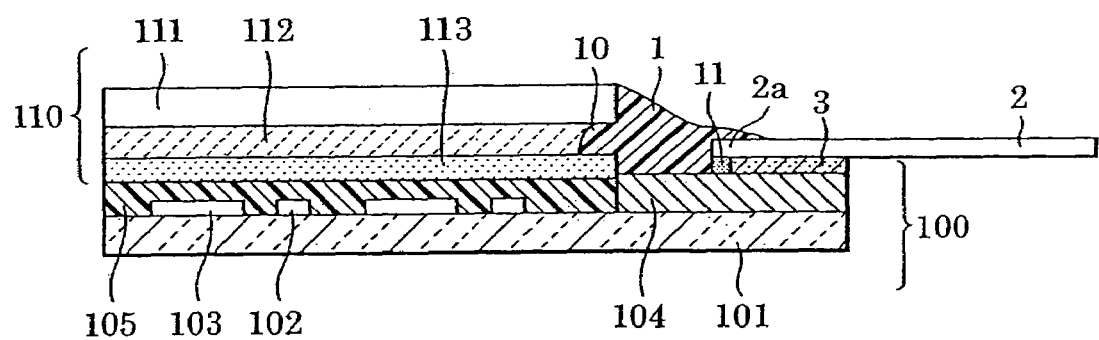
FIG. 9 is a cross-sectional view of an example of conventional radiation detection devices.

Similarly to Example 1, the terminal (electrode terminal) 2a of the flexible circuit board 2 was bonded to the sensor panel 100. Subsequently, a sealing resin (sealer 1) was formed adjacently to the end of the scintillator layer 112 and also adjacently to the terminal 2a of the flexible circuit board 2 at the same time (see FIG. 9).

As a material for the sealing resin, an acrylic resin having a fluid property (TF-1159EB-14, viscosity of 200 cP, manufactured by HITACHI KASEI Co., Ltd.) was applied. After the coating, the resin was dried and hardened with a air-blow at 23° C. for 20 minutes.

The radiation detection device of Comparative Example 1 as described above was irradiated with X-rays. Thus, an image was obtained, and observed. As a result, it was ascertained that the image has a defect, which was probably caused by the sinking of the sealing resin into the end of the scintillator. The radiation detection device was disassembled. It was found that the sealing resin sunk into the pores of the scintillator layer in a width of about 5 to 10 mm from the end of the scintillator.

COMPARATIVE EXAMPLE 2

Similar to Example 1, the terminal (electrode terminal) 2a of the flexible circuit board 2 was bonded to the sensor panel 100. Subsequently, a sealing resin (sealer 1) was formed adjacent to the end of the scintillator layer 112 and also adjacent to the terminal 2a of the flexible circuit board 2 at the same time (see FIG. 9).

As a material for the sealing resin, an acrylic resin having a semi-fluid property (XVL-14, viscosity of 12000 cP, manufactured by Kyoritsu Chemical Co., Ltd.) was applied by means of a dispenser. The sealing resin did not enter the gap under the terminal. Thus, pores were formed. Before the formed pores disappeared, the resin was irradiated with UV (ultraviolet) rays (power of 4500 mJ/cm$^2$, irradiation for 10 seconds) by means of a UV irradiation apparatus, so that the resin was cured.

For examination of the service life, the radiation detection device of Comparative Example 1 formed as described above was let to stand in the environment of a temperature of 60° C. and a humidity of 90% for 1000 hours (h). After the standing, the radiation detection device was irradiated with X-rays, and thus, an image was obtained. It was observed whether the obtained image was deficient or not due to the peeling or breaking of the scintillator. The image was found to be deficient. Probably, this image-deficiency occurred since the electrode was broken due to the corrosion of the terminal 2a of the flexible circuit board 2. The terminal 2a of the flexible circuit board 2 was disassembled and examined. It was found that pores existed in the end of the terminal 2a, and a corroded portion was present in the pore area.

FIG. 11 shows the preparation conditions of Comparative Examples 1 and 2, and the test results.

Application examples are described below.

Figure 8:
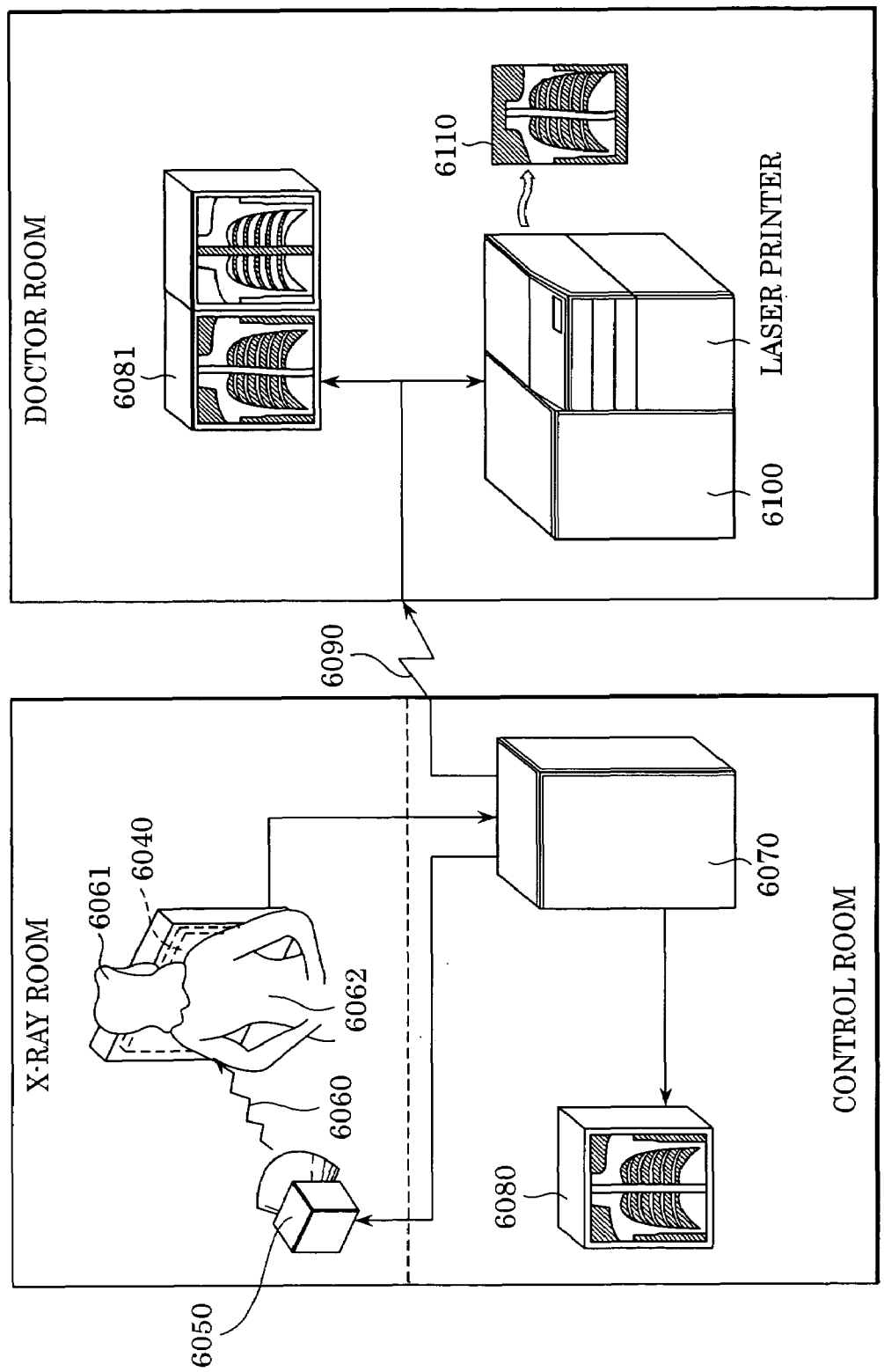
FIG. 8 is a conceptual view showing the configuration of a radiation photographic system according to an example of the application of the present invention.

FIG. 8 shows an example in which the radiation detection device of the present invention is applied to an X-ray diagnostic system. In FIG. 8, X-rays 6060 generated in an X-ray tube 6050 are transmitted through the chest 6062 of a patient or test subject 6061, and are made incident on a radiation detection device (image sensor) 6040 shown in FIG. 4. The incident X-rays carry the internal information of a body of the subject 6061. A scintillator emits light corresponding to the incidence of the X-rays. The light is photoelectrically converted by means of the photoelectrical conversion elements of a sensor panel. Thus, electrical information is obtained. The information is converted to digital information, and image-processed with an image processor 6070, which is a signal processing means. The image can be observed by means of a display 6080, which is a display means in a control room.

This information can be transferred to a remote site by means of a transmission processing means such as a telephone circuit 6090. Thus, the information can be displayed on a display 6081, which is a displaying means in a doctor room distant from the X-ray room, or can be stored in a recording means such as an optical disc or the like. Thus, a doctor in a remote site can use the information for diagnosis. Moreover, the information can be recorded on a film 6110 by means of a microprocessor 6100, which is a recording means.

As described above, the present invention can be applied to a medical X-ray sensor or the like. The present invention can be effectively applied to non-destruction inspection and other uses.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A radiation detection device comprising:
a sensor panel comprising a photoelectric conversion portion, the photoelectric conversion portion comprising a plurality of photoelectric conversion elements arranged in a one-dimensional or two-dimensional pattern on a substrate, and the sensor panel further comprising an electrode lead-out portion arranged in the outer periphery of the substrate;
a flexible circuit board electrically connected to the electrode lead-out portion via a connection portion;
a scintillator panel bonded on the sensor panel, the scintillator panel comprising a scintillator layer for converting radiation to a light which can be sensed by the photoelectric conversion elements; and
a sealing portion which covers an end of the scintillator layer and an end of the connection portion on the sensor panel,
wherein the sealing portion comprises a first sealing resin which covers the end of the scintillator layer except an upper area corresponding to the photoelectric conversion portion, and a second sealing resin which covers the end of the connection portion and which is in contact with the first sealing resin.

2. A radiation detection device according to claim 1, wherein the second sealing resin is formed with a material which is different from that of the first sealing resin.

3. A radiation detection device according to claim 1, wherein the second sealing resin is formed with a material having a color different from that of the first sealing resin.

4. A radiation detection device according to claim 3, wherein the first sealing resin is formed with a material having a black color.

5. A radiation detection device according to claim 1, wherein the sealing portion further comprises a third sealing resin which is in contact with the first sealing resin and the second sealing resin.

6. A radiation detection system comprising:
the radiation detection device according to claim 1;
signal processing means for processing a signal from the radiation detection device so as to obtain an image;
recording means for recording a signal from the signal processing means;
displaying means for displaying a signal from the signal processing means;

transmission processing means for transmitting a signal from the signal processing means;

and a radiation source for generating radiation for detection by the radiation detection device.

7. A method of producing a radiation detection device, the radiation detection device comprising a sensor panel comprising a photoelectric conversion portion, the photoelectric conversion portion comprising a plurality of photoelectric conversion elements arranged in a one-dimensional or two-dimensional pattern on a substrate, and the sensor panel further comprising an electrode lead-out portion arranged in the outer periphery of the substrate, the method comprising the steps of:

electrically connecting a flexible circuit board to the electrode lead-out portion via a connection portion;

arranging a scintillator panel on the photoelectric conversion portion, the scintillator panel comprising a scintillator layer for converting radiation to a light which can be sensed by the photoelectric conversion elements;

covering an end of the scintillator layer with a first sealing resin material; and after having covered the end of the scintillator layer, covering the connection portion with a second sealing resin material, and bringing the second sealing resin material in contact with the first sealing resin material.

8. A method of producing a radiation detection device according to claim 7, wherein the second sealing resin material comprises a material which is different from that of the first sealing resin material.

9. A method of producing a radiation detection device according to claim 7, wherein the second sealing resin material has a viscosity different from that of the first sealing resin material.

10. A method of producing a radiation detection device according to claim 9, wherein the second sealing resin material has a lower viscosity than that of the first sealing resin material.

11. A method of producing a radiation detection device according to claim 7, wherein the second sealing resin material has a thixotropic property different from that of the first sealing resin material.

12. A method of producing a radiation detection device according to claim 11, wherein the second sealing resin material has a lower thixotropic property than that of the first sealing resin material.

* * * * *